(12) United States Patent
Vilermo et al.

(10) Patent No.: US 10,148,240 B2
(45) Date of Patent: Dec. 4, 2018

(54) METHOD AND APPARATUS FOR SOUND PLAYBACK CONTROL

(71) Applicant: Nokia Technologies Oy, Espoo (FI)

(72) Inventors: Miikka Tapani Vilermo, Siuro (FI); Riitta Vaananen, Helsinki (FI)

(73) Assignee: NOKIA TECHNOLOGIES OY, Espoo (FI)

(*) Notice: Subject to any disclaimer, the term of this patent is extended or adjusted under 35 U.S.C. 154(b) by 0 days.

(21) Appl. No.: 14/226,157

(22) Filed: Mar. 26, 2014

(65) Prior Publication Data

US 2015/0280669 A1 Oct. 1, 2015

(51) Int. Cl.
*H03G 3/20* (2006.01)
*H04R 1/10* (2006.01)
*H04R 5/033* (2006.01)
*G10K 11/178* (2006.01)

(52) U.S. Cl.
CPC ............ *H03G 3/20* (2013.01); *H04R 1/1041* (2013.01); *H04R 5/033* (2013.01); *G10K 11/178* (2013.01); *H04R 1/1083* (2013.01); *H04R 2430/01* (2013.01)

(58) Field of Classification Search
None
See application file for complete search history.

(56) References Cited

U.S. PATENT DOCUMENTS

| 6,360,187 | B1 | 3/2002 | Hermann |
| 8,588,432 | B1 | 11/2013 | Simon |
| 2009/0034748 | A1* | 2/2009 | Sibbald ............... G10K 11/178 381/71.6 |
| 2009/0073950 | A1 | 3/2009 | Guccione et al. |
| 2010/0086138 | A1 | 4/2010 | Nicolino, Jr. et al. |
| 2010/0111337 | A1 | 5/2010 | Silber et al. |
| 2010/0119077 | A1* | 5/2010 | Platz ...................... A61F 11/08 381/72 |
| 2012/0148060 | A1 | 6/2012 | Isberg et al. |

(Continued)

FOREIGN PATENT DOCUMENTS

| EP | 2 587 833 A1 | 5/2013 |
| WO | WO 2008/138349 A2 | 11/2008 |
| WO | WO 2011/095912 A1 | 8/2011 |

OTHER PUBLICATIONS

Extended European Search Report for corresponding European Application No. 15160273.7 dated Aug. 20, 2015, 6 pages.

(Continued)

*Primary Examiner* — Andrew C Flanders
*Assistant Examiner* — Kenny Truong
(74) *Attorney, Agent, or Firm* — Alston & Bird LLP

(57) ABSTRACT

A method, apparatus and computer program product are provided in order to coordinate the control of the volume levels of both the playback sound and the ambient sound delivered to a user via headphones. In the context of a method for controlling sound reproduction from an electronic device, a control signal is received in response to user actuation of a single input. The method also receives both playback sound and ambient sound around the electronic device. In response to the control signal, the method controls volume levels of both the playback sound and the ambient sound provided to an output channel configuration of a headphone device.

14 Claims, 8 Drawing Sheets

(56) References Cited

U.S. PATENT DOCUMENTS

| | | | |
|---|---|---|---|
| 2013/0101126 A1* | 4/2013 | Van De Par | H04R 1/1041 381/57 |
| 2013/0165178 A1 | 6/2013 | Lee et al. | |
| 2013/0166050 A1 | 6/2013 | Duwenhorst | |
| 2014/0277930 A1* | 9/2014 | Pan | H04R 1/00 701/36 |
| 2014/0314245 A1* | 10/2014 | Asada | H04R 1/1083 381/71.6 |

OTHER PUBLICATIONS

Dynamic Volume Free—Android Apps on Google Play [online] [retrieved Feb. 3, 2014]. Retrieved from the Internet: <URL: https://play.google/com/store/apps/details?id=com.manna_apps.dynamicvolumefree&hl=en>, (dated May 4, 2013) 2 pages.

AutoVolume=Best Music App for iPone—Automatic Volume Control [onlin] [retrieved Feb. 3, 2014]. Retrieved from the Internet: <URL: http://www.youtube.com/watch?v=GggQ-I-U2b0>, (dated Aug. 17, 2011) 2 pages.

Acoustic Noise Cancelling Headphones—Bose [online] [retrieved Dec. 16, 2016]. Retrieved from the Internet: <URL: https://web.archive.org/web/20131219110856/http://www.bose.co.uk/GB/en/home-and-personal-audio/headphones-and-headsets/acoustic-noise-cancelling-headphones/>. 3 pages.

Ramo, Jussi; "Evaluation of an Augmented Reality Audio Headset Mixer"; Helsinki University of Technology; Faculty of Electronics, Communications and Automation, Department of Signal Processing and Acoustics; Espoo, May 5, 2009; 81 pages.

Peltola, Mikko; "Augmented Reality Audio Applications in Outdoor Use"; Helsinki University of Technology; Faculty of Electronics, Communications and Automation, Department of Signal Processing and Acoustics; Espoo, Feb. 23, 2009; 75 pages.

Albrecht, Robert; "Messaging in Mobile Augmented Reality Audio"; Aalto University; School of Electrical Engineering, Espoo, Jan. 31, 2011; 60 pages.

Office Action for European Application No. 15 160 273.7 dated Mar. 31, 2017.

* cited by examiner

METHOD AND APPARATUS FOR SOUND PLAYBACK CONTROL

TECHNOLOGICAL FIELD

An example embodiment of the present invention relates generally to the delivery of playback sound via headphones and, more particularly, to the coordinated control of the volume of the playback sound and the ambience level of the ambient sound delivered via the headphones.

BACKGROUND

In addition to delivering playback sound, such as music or other audio signals, to a user, some headphones may also control the ambient sound in the vicinity of the user that is heard by the user. For example, some headphones may include active noise cancellation (ANC) in order to permit a user to better hear the playback sound delivered via the headphones in a relatively noisy environment or to otherwise block at least some of the background noise that may otherwise be distracting to the user. Some headphones that include ANC may permit the level of ANC to be controlled such that the level of ambient noise heard by the user can be controlled.

Headsets that include ANC generally attenuate the ambient noise both by mechanical attenuation, such as provided by in-ear headphones or headphones that have a similar type of structure to ear protectors, and by noise cancellation signal processing. The noise cancellation signaling processing may be performed by the headset or by a separate device, such as a dongle, connected to the headset. A headset that includes ANC may include a switch or other input that permits the ANC to be turned on and off by the user.

Another technique to control the level of ambient sound heard by the user of a headset is to employ acoustic transparency. In this regard, a headset that naturally attenuates the ambient sound in a mechanical fashion, such as provided by an in-ear headset, may also provide acoustic transparency to enable for example, augmented reality audio. In order to provide acoustic transparency, a virtual sound source is added to the real audio environment of a user, such as the ambient sound that would be heard by the user if the user were not wearing headphones.

Some headsets may combine both acoustic transparency and ANC functionality to enable a transition from complete acoustic transparency to complete ANC with various hybrid combinations of acoustic transparency and ANC therebetween. By combining acoustic transparency and ANC functionality, the continuum of the volume of the user's sound environment may transition from total blocking of the acoustic environment to total transparency.

Some headsets that include ANC functionality also include an acoustic hear-through functionality. The acoustic hear-through functionality can be actuated with a separate control input and, once actuated, permits the user to have a conversation. In this regard, the user may have a conversation since audio signals having speech frequencies are not cancelled once the acoustic hear-through functionality has been actuated even though the ANC functionality generally remains operational, at least for audio signals having frequencies other than the speech frequencies.

In addition to providing an input to activate or deactivate the ANC functionality and/or acoustic transparency, the user may separately control the volume of the playback sound. As a result of the multiple controls that may be configured or set by the user, the user may be confused or otherwise unable to determine the preferred setting for the volume of the playback sound and the ambience level of the ambient sound. As such, some users of headphones may simply always leave the ANC functionality or the acoustic transparency activated and may then separately control the volume of the playback sound, such as by increasing volume of the playback sound in instances in which the ambient sound is louder and by reducing the volume of the playback sound in instances in which the ambient sound is softer. In particularly noisy environments, the user may simply increase the volume of the playback sound and, in some instances, may increase the volume of the playback sound to such a level that the combined volume of the playback sound and the ambience level of the ambient sound is uncomfortable for the user.

BRIEF SUMMARY

A method, apparatus and computer program product are provided in accordance with an example embodiment in order to facilitate control of the volume levels of both the playback sound and the ambient sound delivered to a user via headphones. In an example embodiment, a control signal may be provided by user actuation of a single input with the control signal serving to control the volume levels of both the playback sound and the ambient sound delivered to the user via the headphones. By permitting both the volume level of the playback sound and the volume level of the ambient sound to be controlled via a single input, the user interface may be simplified and the control of playback sound and the ambient sound may be more integrated than headphones that are responsive to separate inputs for the volume levels of the playback sound and the ambient sound.

In an example embodiment, a method for controlling sound reproduction from an electronic device is provided that includes receiving a control signal responsive to user actuation of a single input. The method of this example embodiment also receive playback sound and determine an ambient sound around the electronic device. In response to the control signal, the method of the example embodiment controls volume levels of both the playback sound and the ambient sound provided to an output channel configuration of a headphone device.

The method of an example embodiment may control the volume levels of the playback sound and the ambient sound by differently modifying the volume level of the playback sound and the volume level of the ambient sound in response to the control signal. In this embodiment, the method may differently modify the volume level of the playback sound and the volume level of the ambient sound by providing more gain to the ambient sound than to the playback sound in response to a first type of control signal and providing more gain to the playback sound than to the ambient sound in response to a second type of control signal.

The method of an example embodiment may control the volume levels of both the playback sound and the ambient sound by modifying the volume level of one but not the other of the playback sound or the ambient sound in response to the control signal. The method of an example embodiment may control the volume levels of both the playback sound and the ambient sound by modifying the volume level of at least one of the playback sound or the ambient sound based upon a difference between signal levels or loudness of the playback sound and the ambient sound. The method of an example embodiment may control the volume levels of both the playback sound and the ambient sound by controlling the volume level of the ambient sound in accordance with a gain curve as a function of the control signal.

In an example embodiment, the method may determine the ambient sound by processing the ambient sound for ambience level control. In this embodiment, the playback sound may include left and right channels of the playback sound and the ambient sound may include left and right channels of the ambient sound. The method of this embodiment may also include, after processing the ambient sound for ambience level control and controlling the volume levels of both the playback sound and the ambient sound, mixing the left channels of the playback sound and the ambient sound and mixing the right channels of the playback sound and the ambient sound for delivery to left and right headphones, respectively.

In another example embodiment, an apparatus for controlling sound reproduction from an electronic device is provided that includes at least one processor and at least one memory storing computer program code with the at least one memory and the stored computer program code being configured, with the at least one processor, to cause the apparatus to at least receive a control signal responsive to user actuation of a single input and also to receive playback sound and to determine an ambient sound around the electronic device. The at least one memory and stored computer program code are configured, with the at least one processor, to also cause the apparatus to control, in response to the control signal, volume levels of both the playback sound and the ambient sound provided to an output channel configuration of a headphone device.

The at least one memory and stored computer program code are configured, with the at least one processor, to cause the apparatus to control the volume levels of both the playback sound and the ambient sound by differently modifying the volume level of the playback sound and the volume level of the ambient sound in response to the control signal. In this embodiment, the at least one memory and stored computer program code are configured, with the at least one processor, to cause the apparatus to differently modify the volume level of the playback sound and the volume level of the ambient sound by providing more gain to the ambient sound than to the playback sound in response to a first type of control signal and by providing more gain to the playback sound than to the ambient sound in response to a second type of control signal.

The at least one memory and stored computer program code are configured, with the at least one processor, to cause the apparatus of an example embodiment to control the volume levels of both the playback sound and the ambient sound by modifying the volume level of one but not the other of the the playback sound or the ambient sound in response to the control signal. The at least one memory and stored computer program code are configured, with the at least one processor, to cause the apparatus of an example embodiment to control the volume levels of both the playback sound and the ambient sound by modifying at least one of the volume level of the playback sound or the volume level of the ambient sound based upon a difference between signal levels or loudness of the playback sound and the ambient sound. In another example embodiment, the at least one memory and stored computer program code are configured, with the at least one processor, to cause the apparatus to control the volume levels of both the playback sound and the ambient sound by controlling the volume level of the ambient sound in accordance with a gain curve as a function of the control signal.

The at least one memory and stored computer program code are configured, with the at least one processor, to cause the apparatus of an example embodiment to determine the ambient sound by processing the ambient sound for ambience level control. In this example embodiment, the playback sound includes left and right channels of the playback sound and the ambient sound includes left and right channels of the ambient sound. The at least one memory and stored computer program code are further configured, with the at least one processor, to cause the apparatus of this example embodiment, after processing the ambient sound for ambience level control and controlling the volume levels of both the playback sound and the ambient sound, to mix the left channels of the playback sound and the ambient sound and to mix the right channels of the playback sound and the ambient sound for delivery to left and right headphones, respectively.

In a further example embodiment, a computer program product for controlling sound reproduction from an electronic device is provided that includes at least one non-transitory computer-readable storage medium having computer-readable program instructions stored therein with the computer-readable program instructions configured, upon execution, to receive a control signal responsive to user actuation of a single input. The computer-readable program instructions of this example embodiment are also configured to receive playback sound and determine an ambient sound around the electronic device and, in response to the control signal, to control volume levels of both the playback sound and the ambient sound provided to an output channel configuration of a headphone device.

The computer-readable program instructions configured to control the volume levels of both the playback sound and the ambient sound may include computer-readable program instructions configured to differently modify the volume level of the playback sound and the volume level of the ambient sound in response to the control signal. In this embodiment, the computer-readable program instructions configured to differently modify the volume level of the playback sound and the volume level of the ambient sound may include computer-readable program instructions configured to provide more gain to the ambient sound than to the playback sound in response to a first type of control signal and to provide more gain to the playback sound than to the ambient sound in response to a second type of control signal.

The computer-readable program instructions configured to control the volume levels of both the playback sound and the ambient sound may include computer-readable program instructions configured to modify the volume level of one but not the other of the playback sound or the ambient sound in response to the control signal. The computer-readable program instructions configured to control the volume levels of both the playback sound and the ambient sound may include, in one example embodiment, computer-readable program instructions configured to modify at least one of the volume level of the playback sound or the volume level of the ambient sound based upon a difference between signal levels or loudness of the playback sound and the ambient sound.

In one example embodiment, the computer-readable program instructions configured to determine the ambient sound may include computer-readable program instructions configured to process the ambient sound for ambience level control. In this embodiment, the playback sound may include left and right channels of the playback sound and the ambient sound may include left and right channels of the ambient sound. The computer-readable program instructions of this example embodiment may be further configured, after processing the ambient sound for ambience level control and controlling the volume levels of the playback sound and the ambient sound, to mix the left channels of the playback sound and the ambient sound and to mix the right channels of the playback sound and the ambient sound for delivery to left and right headphones, respectively.

In yet another example embodiment, an apparatus for controlling sound reproduction from an electronic device is provided that includes means for receiving a control signal responsive to user actuation of a single input. The apparatus of this example embodiment also includes means for receiving playback sound and determine an ambient sound around the electronic device. The apparatus of this embodiment also includes means for controlling, in response to the control signal, volume levels of both the playback sound and the ambient sound provided to an output channel configuration of a headphone device.

BRIEF DESCRIPTION OF THE DRAWINGS

Figure 1:
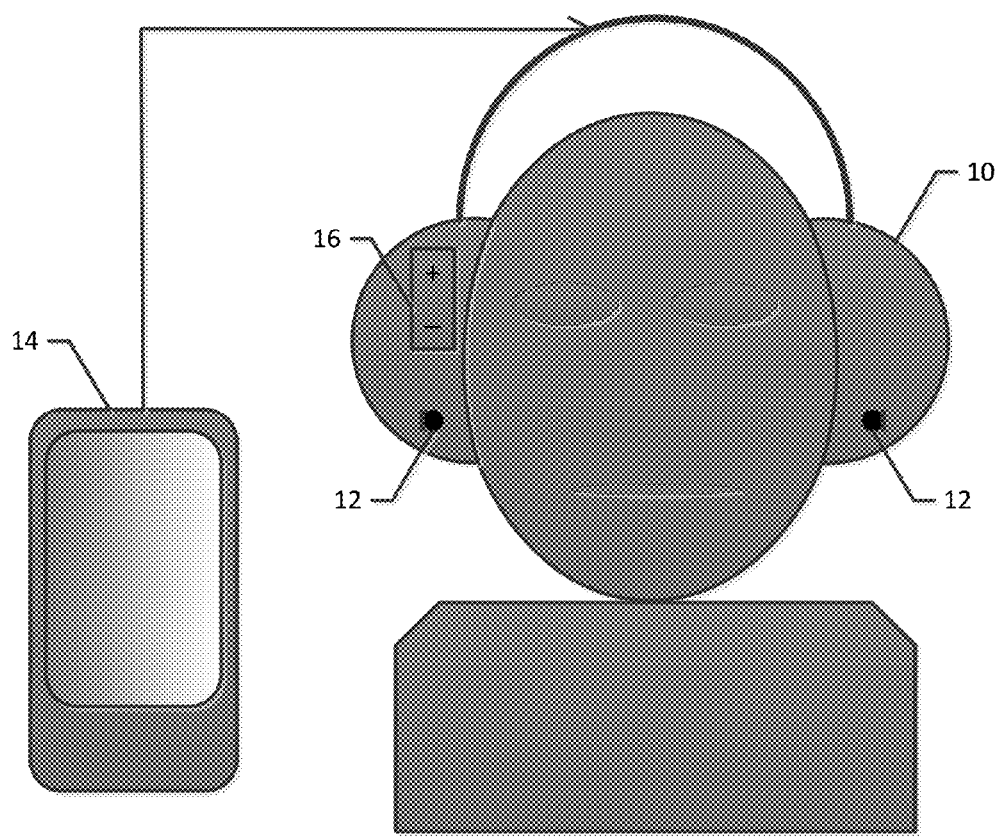
Figure 2:
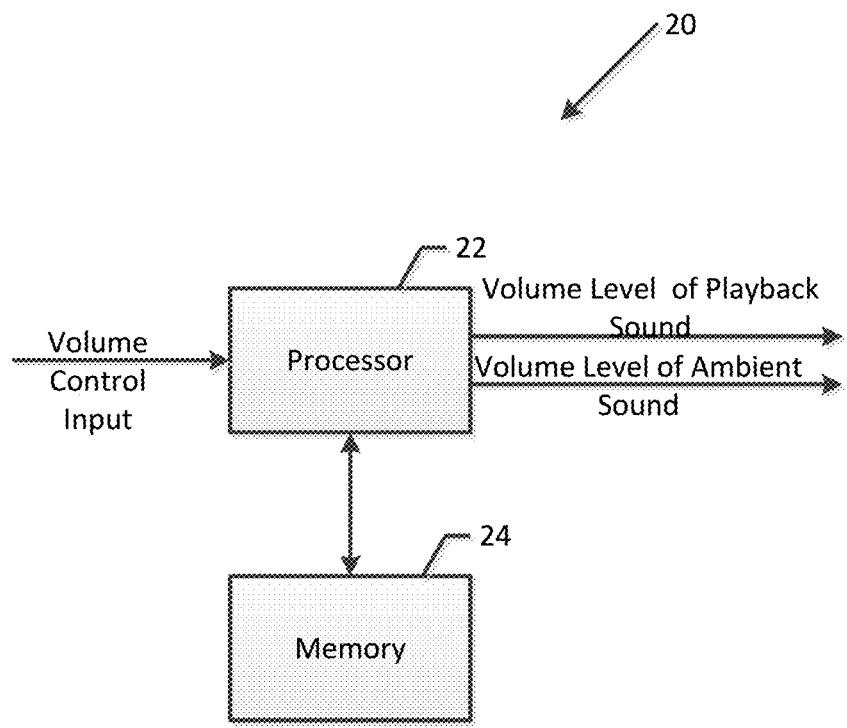
Figure 3:
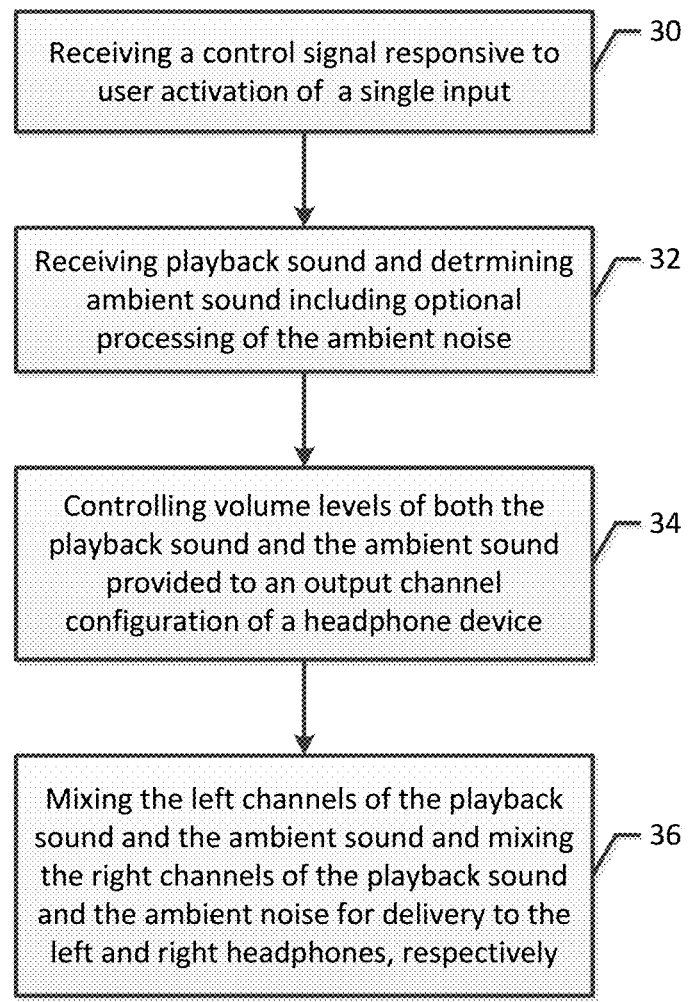
Figure 4:
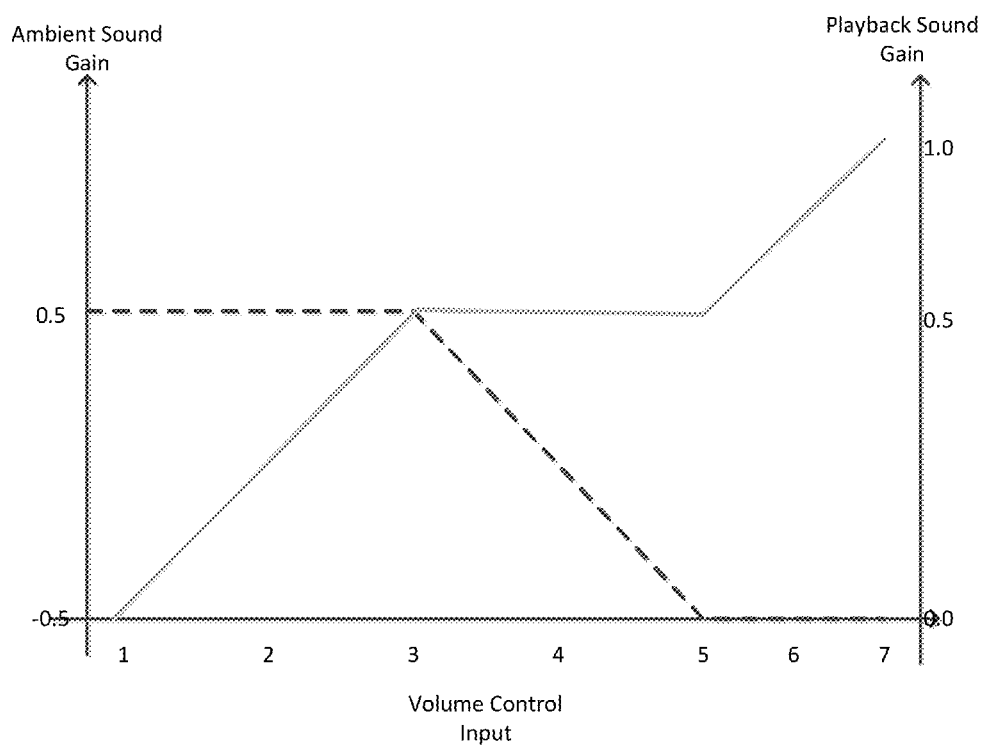
Figure 5:
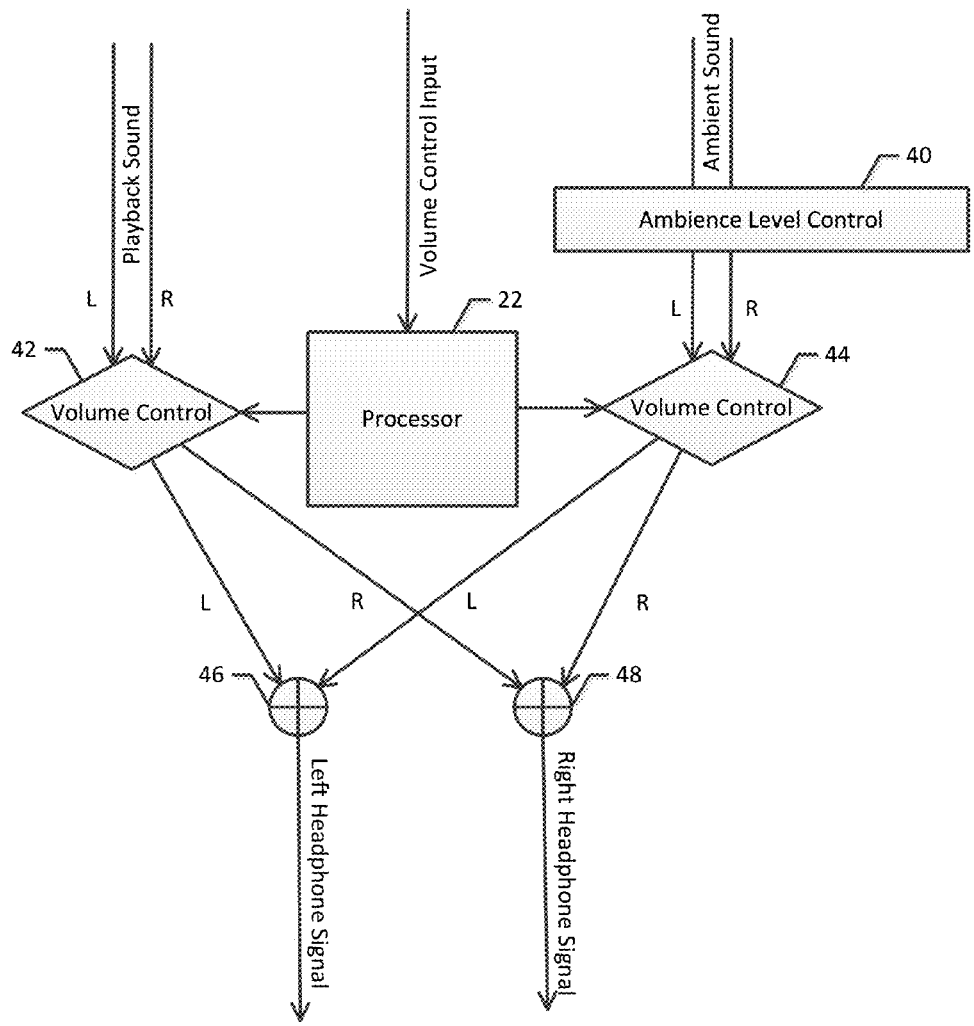
Figure 6:
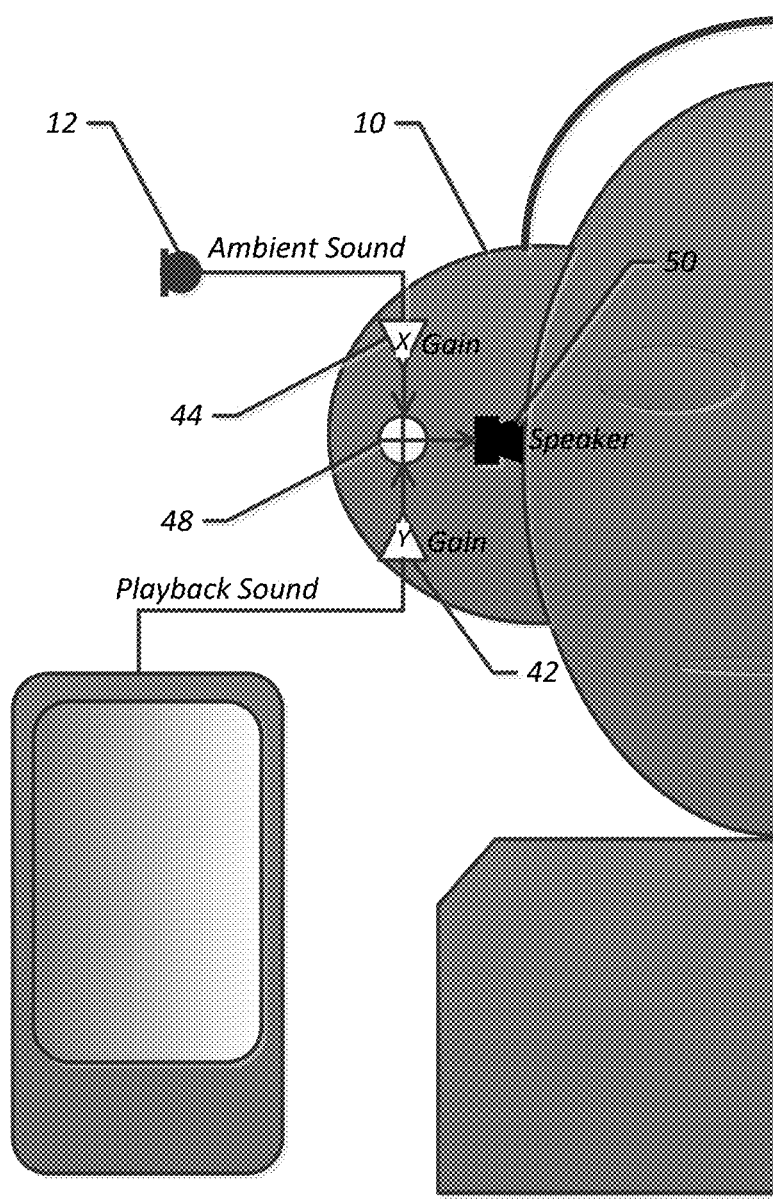
Figure 7:
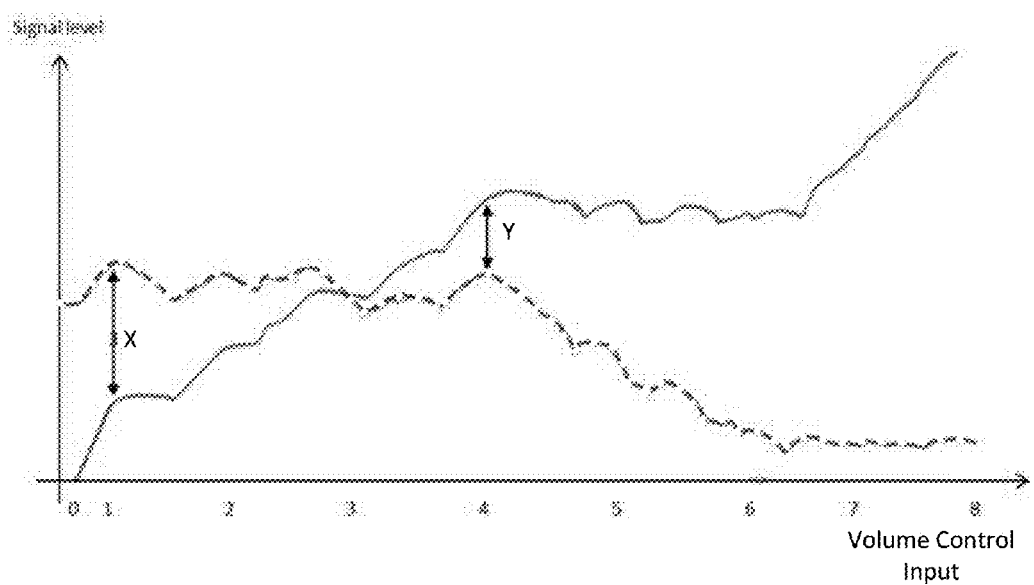
Figure 8:
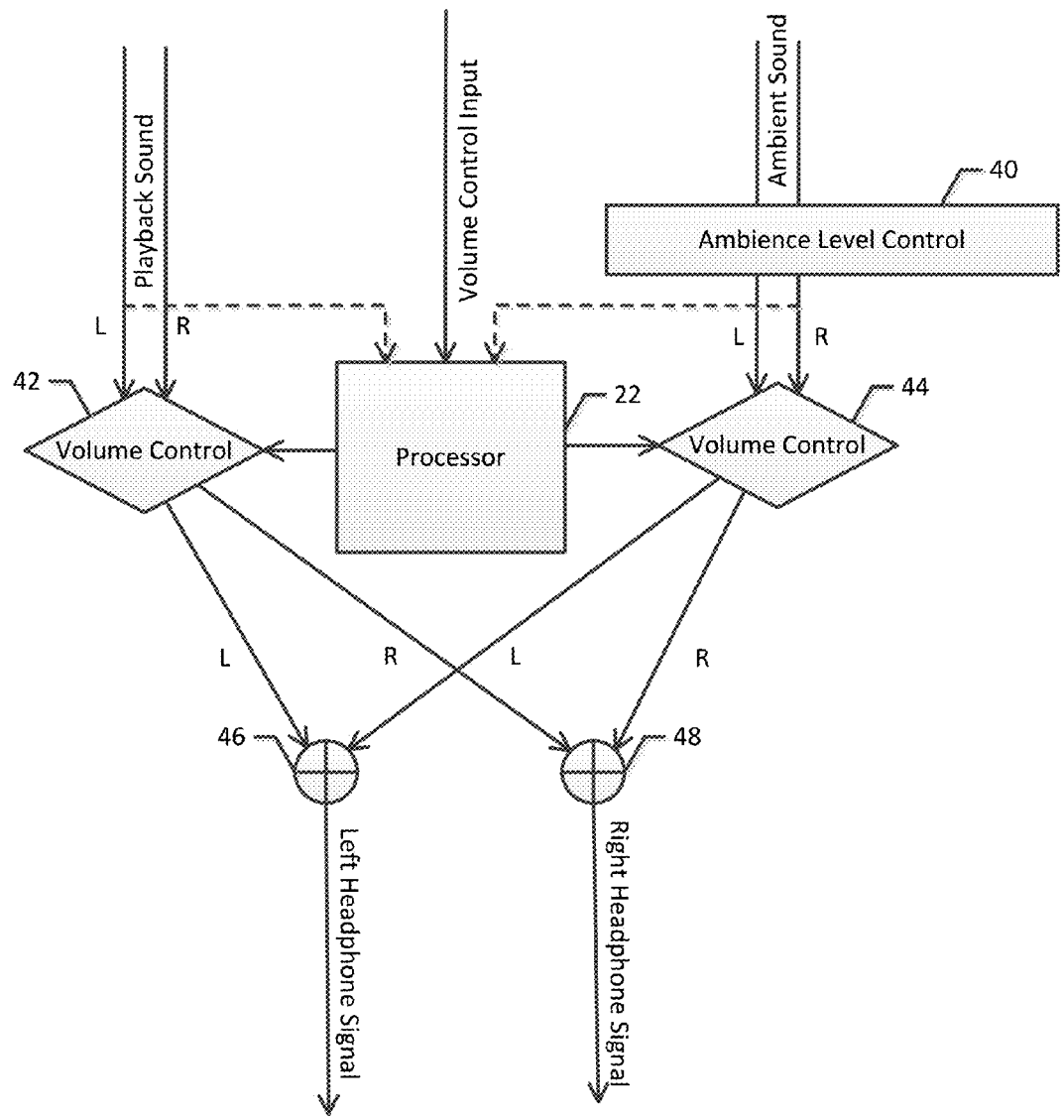

Having thus described aspects of the present disclosure in general terms, reference will now be made to the accompanying drawings, which are not necessarily drawn to scale, and wherein:

FIG. 1 illustrates a user wearing headphones that may permit the volume levels of playback sound and the ambient sound to both be controlled via a single input in accordance with an example embodiment of the present invention;

FIG. 2 is a block diagram of an apparatus that may be specifically configured in accordance with an example embodiment of the present invention in order to permit the control of the volume levels of both playback sound and the ambient sound in response to a single input;

FIG. 3 is a flowchart illustrating operations performed, such as by the apparatus of FIG. 2, in accordance with an example embodiment of the present invention;

FIG. 4 is a graphical representation of the gain curves for the volume level of the playback sound and the volume level of the ambient sound as a function of the control signal in accordance with an example embodiment of the present invention;

FIG. 5 is a block diagram illustrating the control of the volume levels of the playback sound and the the ambient sound delivered to the user via headphones in response to a single volume control input in accordance with an example embodiment of the present invention;

FIG. 6 illustrates the user wearing headphones that are configured to separately provide gain to the playback sound and the ambient sound as a function of the single input in accordance with an example embodiment of the present invention;

FIG. 7 is a graphical representation of the gain curves for the volume levels of the playback sound and the ambient sound in accordance with another example embodiment of the present invention in which the volume levels of the playback sound and/or the ambient sound is modified based upon a difference between signal levels or loudness of the playback sound and the ambient sound; and FIG. 8 is a block diagram illustrating the control of the volume levels of the playback sound and the ambient sound delivered to the user via headphones in response to a single volume control input in accordance with another embodiment of the present invention.

DETAILED DESCRIPTION

Some embodiments of the present invention will now be described more fully hereinafter with reference to the accompanying drawings, in which some, but not all, embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout. As used herein, the terms "data," "content," "information," and similar terms may be used interchangeably to refer to data capable of being transmitted, received and/or stored in accordance with embodiments of the present invention. Thus, use of any such terms should not be taken to limit the spirit and scope of embodiments of the present invention.

Additionally, as used herein, the term 'circuitry' refers to (a) hardware-only circuit implementations (for example, implementations in analog circuitry and/or digital circuitry); (b) combinations of circuits and computer program product(s) comprising software and/or firmware instructions stored on one or more computer readable memories that work together to cause an apparatus to perform one or more functions described herein; and (c) circuits, such as, for example, a microprocessor(s) or a portion of a microprocessor(s), that require software or firmware for operation even if the software or firmware is not physically present. This definition of 'circuitry' applies to all uses of this term herein, including in any claims. As a further example, as used herein, the term 'circuitry' also includes an implementation comprising one or more processors and/or portion(s) thereof and accompanying software and/or firmware. As another example, the term 'circuitry' as used herein also includes, for example, a baseband integrated circuit or applications processor integrated circuit for a mobile phone or a similar integrated circuit in a server, a cellular network device, other network device, and/or other computing device.

As defined herein, a "computer-readable storage medium," which refers to a non-transitory physical storage medium (for example, volatile or non-volatile memory device), can be differentiated from a "computer-readable transmission medium," which refers to an electromagnetic signal.

A method, apparatus and computer program product for controlling sound reproduction from an electronic device are provided in accordance with an example embodiment in order to permit both the volume level of playback sound, such as music or other audio signals, and the volume level of the ambient sound provided to an output channel configuration of a headphone device, such as a pair of headphones, to be controlled in an integrated manner in response to a single input. As such, the control of the volume levels of both the playback sound and the ambient sound including, for example, ambient noise, may be coordinated in a consistent manner while simplifying the user interface relative to user interfaces having a plurality of controls for the volume level of the playback sound and the volume level of the ambient sound.

Referring now to FIG. 1, a user wearing headphones 10 is depicted. While a pair of headphones that covers the ears of the user are depicted, the headphones via which the playback sound and the ambient sound is controllably delivered to the user via example embodiments of the present invention, may be any of a wide variety of headphones including in-ear headphones. The headphones are configured to control the volume level of the ambient sound which is to be delivered to the user. As such, the headphones may provide for ambience level control, such as by providing for active noise cancellation and/or acoustic transparency. Regardless of the type of ambience level control, the headphones may include one or more microphones 12, such as a right side microphone associated with the right headphone and the left microphone associated with the left headphone, to capture the ambient sound around the electronic device, such as in the vicinity of the user.

As also shown in FIG. 1, playback sound may be provided to the headphones 10 for delivery to the user. The playback sound may be provided by various sources. In some embodiments, the source of the playback sound may be included within the headphones. Alternatively, the source of the playback sound maybe another device that is distinct from the headphones, but that is in communication with the headphones, such as via a wire line connection as shown in FIG. 1 or via wireless communications. In this embodiment, various types of electronic devices which may provide the playback sound including a mobile terminal 14 as shown in FIG. 1. In this embodiment, the mobile terminal may be embodied as a personal digital assistant (PDA), mobile telephone, smartphone, companion device, for example, a smart watch, dongle, pager, mobile television, gaming device, laptop computer, camera, tablet computer, touch surface, video recorder, audio/video player, radio, electronic book, positioning device (for example, global positioning system (GPS) device), or any combination of the aforementioned, and other types of audio communications systems. Alternatively, the source of the playback sound may be a fixed electronic device, such as a computer workstation, a personal computer, a stereo or the like. Regardless of the type of source of the playback sound, a variety of different types of playback sounds may be provided to the headphones for delivery to the user, along with the ambient sound. For example, the playback sound may include music, a telephone conversation or other audio signals.

As also shown in FIG. 1, a user interface 16 may also be provided via which a user may provide a single input so as to control the volume levels of the playback sound and the ambient sound that is provided to an output channel configuration of a headphone device, such as the headphones 10. The user interface may be carried by the headphones as is shown in the embodiment of FIG. 1, by the source of the playback sound, such as a mobile terminal 14, or by another device in communication with the headphones and/or the source of the playback sound, such as a dongle carried by the user or the like. Regardless of the location of the user interface and/or the device that carries the user interface, the user interface may provide a single input, such as a mechanical input device, e.g., a rocking mechanical button, a slider, a rotatable knob or the like, or a software generated input device, e.g., a button or other input presented upon a graphical user interface, such as may be presented upon the graphical user interface of the mobile terminal 14, that is responsive to user actuation so as to provide a control signal as described below.

Referring now to FIG. 2, an apparatus 20 that may be specifically configured in accordance with an example embodiment in order to control the volume level of the playback sound and the volume level of the ambient sound delivered to a user via headphones 10 in response to the control signal defined by user actuation of a single input is depicted. The apparatus may be embodied in various manners, such as being embodied by the headphones, the source of the playback sound, such as the mobile terminal 14, or another device in communication with the headphones and/or the source of the playback sound, such as a dongle carried by the user. Alternatively, the apparatus may be distributed with different components being embodied by different ones by the headphones, the source of the playback sound, or other devices in communication therewith.

Regardless of the manner in which the apparatus 20 is embodied, the apparatus may include or otherwise be in communication with a processor 22 and a memory device 24, and optionally a user interface and a communication interface. In some embodiments, the processor (and/or co-processors or any other processing circuitry assisting or otherwise associated with the processor) may be in communication with the memory device via a bus for passing information among components of the apparatus. The memory device may be non-transitory and may include, for example, one or more volatile and/or non-volatile memories. In other words, for example, the memory device may be an electronic storage device (for example, a computer readable storage medium) comprising gates configured to store data (for example, bits) that may be retrievable by a machine (for example, a computing device like the processor). The memory device may be configured to store information, data, content, applications, instructions, or the like for enabling the apparatus to carry out various functions in accordance with an example embodiment of the present invention. For example, the memory device could be configured to buffer input data for processing by the processor. Additionally or alternatively, the memory device could be configured to store instructions for execution by the processor.

As noted above, the apparatus 20 may be embodied by headphones 10, a source of playback sound, such as a mobile terminal 14, or another device in communication therewith. However, in some embodiments, the apparatus may be embodied as a chip or chip set. In other words, the apparatus may comprise one or more physical packages (for example, chips) including materials, components and/or wires on a structural assembly (for example, a circuit board). The structural assembly may provide physical strength, conservation of size, and/or limitation of electrical interaction for component circuitry included thereon. The apparatus may therefore, in some cases, be configured to implement an embodiment of the present invention on a single chip or as a single "system on a chip." As such, in some cases, a chip or chipset may constitute means for performing one or more operations for providing the functionalities described herein.

The processor 22 may be embodied in a number of different ways. For example, the processor may be embodied as one or more of various hardware processing means such as a coprocessor, a microprocessor, a controller, a digital signal processor (DSP), a processing element with or without an accompanying DSP, or various other processing circuitry including integrated circuits such as, for example, an ASIC (application specific integrated circuit), an FPGA (field programmable gate array), a microcontroller unit (MCU), a hardware accelerator, a special-purpose computer chip, or the like. As such, in some embodiments, the processor may include one or more processing cores configured to perform independently. A multi-core processor may enable multiprocessing within a single physical package. Additionally or alternatively, the processor may include one or more processors configured in tandem via the bus to enable independent execution of instructions, pipelining and/or multithreading.

In an example embodiment, the processor 22 may be configured to execute instructions stored in the memory device 24 or otherwise accessible to the processor. Alternatively or additionally, the processor may be configured to execute hard coded functionality. As such, whether configured by hardware or software methods, or by a combination thereof, the processor may represent an entity (for example, physically embodied in circuitry) capable of performing operations according to an embodiment of the present invention while configured accordingly. Thus, for example, when the processor is embodied as an ASIC, FPGA or the like, the processor may be specifically configured hardware for conducting the operations described herein. Alternatively, as another example, when the processor is embodied as an executor of software instructions, the instructions may specifically configure the processor to perform the algorithms and/or operations described herein when the instructions are executed. However, in some cases, the processor may be a processor of a specific device (for example, the client device 10 and/or a network entity) configured to employ an embodiment of the present invention by further configuration of the processor by instructions for performing the algorithms and/or operations described herein. The processor may include, among other things, a clock, an arithmetic logic unit (ALU) and logic gates configured to support operation of the processor.

The apparatus 20 of an example embodiment may optionally also include or otherwise be in communication with a user interface. The user interface may include one or more inputs including the single input, such as a mechanical input device, a software generated input device, e.g., a touch screen display, or the like, that is responsive to user actuation to provide the control signal that controls the volume levels of both the playback sound and the ambient sound as described below. As such, the user interface may include a touch screen display, a keyboard, a mouse, a joystick or other input/output mechanisms. In some embodiments, the user interface, such as a display, speakers, or the like, may also be configured to provide output to the user. In an embodiment in which the apparatus includes a user interface including the single input, the user interface is in communication with the processor 22 such that an indication of the user input may be provided to the processor. However, even in an instance in which the apparatus does not include a user interface and the single input is provided by another device, the apparatus, such as the processor, is in communication with the single input so as to receive an indication of the user input. In an example embodiment in which the apparatus does include the user interface, however, the processor may comprise user interface circuitry configured to control at least some functions of one or more input/output mechanisms. The processor and/or user interface circuitry comprising the processor may be configured to control one or more functions of one or more input/output mechanisms through computer program instructions (for example, software and/or firmware) stored on a memory accessible to the processor (for example, memory device 24, and/or the like).

The apparatus 20 of the illustrated embodiment may also optionally include a communication interface that may be any means such as a device or circuitry embodied in either hardware or a combination of hardware and software that is configured to receive and/or transmit data from/to a communications device in communication with the apparatus. For example, the communication interface may be configured to receive playback sound from various sources, such as a mobile terminal 14, in an instance in which the apparatus is remote from the source, to communicate with the headphones 10 in an instance in which the apparatus is remote from the headphones and/or to receive user input via the single input in an instance in which the single input is provided via another device, such as a mobile terminal, a dongle or the like. In this regard, the communication interface may include, for example, an antenna (or multiple antennas) and supporting hardware and/or software for enabling communications with a wireless communication network. Additionally or alternatively, the communication interface may include the circuitry for interacting with the antenna(s) to cause transmission of signals via the antenna(s) or to handle receipt of signals received via the antenna(s). In some environments, the communication interface may alternatively or also support wired communication.

Referring now to FIG. 3, the operations performed, such as by the apparatus 20 of FIG. 2, in accordance with an example embodiment, of the present invention are depicted. As shown in block 30 of FIG. 3, the apparatus may include means, such as the processor 22 or the like, for receiving a control signal responsive to user actuation of a single input, such as via a user interface described above. As shown in FIG. 2, for example, the single input may be provided in the form of a volume control input. As shown in block 32 of FIG. 3, the apparatus may also include means, such as the processor, the headphones 10 or the like, for receiving playback sound and determining an ambient sound. In this regard, the playback sound may be provided to the processor, the headphones or the like by a source of the playback sound, such as mobile terminal 14 in the embodiment of FIG. 1, memory 24 in regards to prestored music or other types of playback sounds or the like. In addition, the ambient sound may be the sound around the electronic device that is be captured by one or more microphones 12 carried by the headphones.

In response to the control signal, the apparatus 20 may include means, such as the processor 22 or the like, for controlling the volume levels of both the playback sound and the ambient sound provided to an output channel configuration of a headphone device, such as the headphones 10. See block 34 of FIG. 3. The apparatus, such as the processor, may be configured to control the volume levels of both the playback sound and the ambient sound in various manners. In an example embodiment, the apparatus, such the processor, may be configured to control the volume level of the playback sound as well as the volume level of the ambient sound in accordance with a gain curve, such as a continuous gain curve or another type of gain curve, as a function of the control signal, thereby providing for a smooth adjustment of the respective gains. As shown in FIG. 4, the gain curves associated with the volume level of the ambient sound and the volume level of the playback may be different with the gain curve that defines the volume level of the ambient sound as a function of the control signal being depicted in dashed lines in FIG. 4, and with the gain curve that defines the volume level of the playback sound as a function of the control signal being shown in solid lines.

As exemplified by the gain curves of FIG. 4, the apparatus 20, such as the processor 22, may be configured to control the volume levels of both the playback sound and the ambient sound by differently modifying the volume level of the playback sound and the volume level of the ambient sound in response to the control signal. Indeed, the apparatus, such as the processor, may be configured to differently modify the volume levels of the playback sound and the ambient sound by providing more gain to the ambient sound than to the playback sound in response to the first type of signal, e.g., volume control inputs of a first set of values, and by providing more gain to the playback sound than to the ambient sound in response to a second type of control signal, e.g., volume control inputs of a second set of values.

With reference to the embodiment of FIG. 4, for example, the apparatus 20, such as the processor 22, may be configured to provide more gain to the ambient sound than to the playback sound for a volume control input less than 3, but to provide more gain to the playback sound than to the ambient sound in response to a volume control input of greater than 3. In this example, the apparatus, such as the processor, may be configured to provide the same gain to both the playback sound and the ambient sound in response to a third type of control signal, such as a volume control input of 3 as also shown in FIG. 4.

By way of further explanation with continued reference to FIG. 4, the headphones 10 via which the playback sound is delivered to the user in this example are configured to actuate all frequencies of ambient sound by one-half during the propagation of the ambient sound through the headphones. As such, for a volume input control of 1, the gain of 0.5 may be applied to the ambient sound captured by the microphone 12 such that in combination with the ambient sound that otherwise passes through the headphones and reaches the user, the ambient sound appears not to have been actuated at all. Also, in response to a volume control of 1, a gain of 0 is applied to the playback sound so that the user does not hear any playback sound. In the example of FIG. 4, and in response to volume control input of 2, the gain applied to the ambient sound captured by a microphone of the headphones remains at 0.5 such that as in combination with the ambient sound that passes through the headphones, the ambient sound appears to not to have been actuated as shown in FIG. 4. The gain applied to the playback sound is increased, however, such that a gain of 0.25 is applied to the playback sound in response to volume control input of 2 such that the user hears some of the playback sound but at a volume level less than the volume level of the ambient sound.

At a volume control of 3, the gain applied to the ambient sound captured by a microphone 12 of the headphones 10 remains at 0.5 such that as in combination with the ambient sound that passes through the headphones, the ambient sound appears to not to have been actuated. In addition, the gain applied to the playback sound has continued to increase such that a gain of 0.5 is also applied to the playback sound such that the playback sound and the ambient sound are heard at about the same level in typical ambience conditions, e.g., 65 dB(A). As the volume control input continues to increase to a volume control input of 4, a gain of 0.5 may continue to be applied to the playback sound, but the gain applied to the ambient sound captured by the microphone associated with the headphones may be decreased such as to 0 such that the ambient sound heard by the user is now only the ambient sound that passes through the headphones and is actuated such as by one-half in this example embodiment. In response to a volume input of 5, a gain of 0.5 is still applied to the playback sound, but a gain of −0.5 is applied to the ambient sound captured by the microphone carried by the headphones. As such, the volume level of the playback sound remains at the same level, but the ambient sound is further attenuated. In this regard, by applying a negative gain equal in magnitude to the ambient sound that passes through the headphones, the ambient sound may be effectively canceled entirely, or at least partly based upon the effectiveness such as the noise cancellation system. For higher levels of the volume control input, the volume level of the playback sound may be increased, such as to a gain of 0.75 at a volume control input of 6 and to a gain of 1.0 at a volume control input of 7, while a gain of −0.5 continues to be applied to the ambient sound such that the ambient sound is effectively cancelled.

As indicated by the foregoing example, the apparatus 20 such as the processor 22, of an example embodiment may control the volume levels of both the playback sound and the ambient sound by modifying the volume level of one, but not the other of the playback sound or the ambient sound in response to the control signal. For example, a volume control input of 4 does not modify the volume level of the ambient sound, e.g., a gain of 0 applied, while the volume level of the playback sound is modified.

In addition, the apparatus 20, such as the processor 22, of an example embodiment may be configured to limit the combination of the playback sound and the ambient sound that is delivered to the user via the headphones 10. As such, the apparatus of this embodiment may prevent exposure of the user to excessively loud audio.

While described above in conjunctions with headphones 10 that attenuate the ambient sound by one-half while the ambient sound passes therethrough, the headphones of other embodiments may differently attenuate the ambient sound, such that the apparatus 20, such as the processor 22, is configured to apply a different gain to the ambient sound that is captured by the microphones 12 in order to provide a similar listening experience for the user as that described above. For example, some headphones differently attenuate different frequencies of the ambient sound.

Referring now to FIG. 5, an example embodiment is provided in which the apparatus 20 controls the volume levels of both the playback sound and the ambient sound based on the control signal provided by a single input. As shown, left and right channels of the playback sound may be provided, such as by a source of the playback sound, as well as left and right channels of ambient sound, such as may be captured by microphones 12 of the headphones 10. The ambient sound may be subjected to ambience level control 40, such as may be provided by active noise cancellation and/or acoustic transparency. In addition, a volume control input maybe received, such as in response to user actuation of a single input. Based upon the volume control input, the apparatus 20, such as a processor 22, may control the volume levels of both the playback sound, such as the volume levels of the left and right channels of the playback sound, and the ambient sound, such as the volume levels of the left and right channels of the ambient sound delivered to the user via the headphones 10. The left channels of the playback sound and the ambient sound may then be mixed prior to being delivered to the user as the left headphone signal and the right channels of the playback sound and the ambient sound may also be mixed prior to being delivered as the right headphone signal. Thus, the apparatus may include means, such as the processor, a mixer or the like, for mixing the left channels of the playback sound and the ambient sound and for mixing the right channels of the playback sound and the ambient sound for delivery to the left and right output channels of the headphones, respectively.

The volume control 42, 44 of the embodiment depicted in FIG. 5 may be provided by respective amplifiers. In one embodiment, the processor 22 may include the amplifiers for providing volume control and/or the mixers 46, 48 for mixing the playback sound and the ambient sound. Alternatively, the amplifiers providing level control and/or the mixers may be discrete components with at least the amplifiers being at least partially controlled by the processor which may provide control signals defining the manner in which the volume levels of the playback signal and the ambient sound are to be modified. By way of example, FIG. 6 depicts a headphone 10 that includes amplifiers to receive the playback sound and the ambient sound that are responsive to signals from the processor that define the manner in which the volume levels of the playback sound and the ambient sound are to be modified. The resulting signals may then be mixed prior to being delivered to the user via speaker 50.

Although depicted to be included within the headphones 10 of FIG. 6, the amplifiers 42, 44 and the mixers 46, 48 may be included in other devices, such as the source of the playback sound, e.g., the mobile terminal 14, or another device, such as a dongle that may be carried or otherwise associated with the user. Moreover, as noted above, the amplifiers and/or the mixers may be embodied by the processor 22 in another embodiment.

As indicated by the example in FIG. 4, the apparatus 20, such as the processor 22, may be configured to control the volume levels of both the playback sound and the ambient sound in a predefined manner based upon the control input and without consideration of the volume level of the other. For example, the apparatus, such as the processor, of an example embodiment may control the volume level of the playback sound without consideration of the volume level of the ambient sound, and may similarly control the volume level of the ambient sound without consideration of the volume level of the playback sound. However, the apparatus, such as the processor, of another example embodiment may be configured to modify the volume levels of both the playback sound and/or the ambient sound based upon the control signal and at least one, e.g., one or both, of the volume level of the playback sound and/or the volume level of the ambient sound. For example, the apparatus, such as the processor, of one example embodiment may be configured to modify at least one of the volume level of the playback sound and/or the volume level of the ambient sound based upon the control signal and the difference between signal levels or loudness of at least the ambient sound. With reference to FIG. 7, for example, the apparatus, such as the processor, of an example embodiment may modify the volume level of the playback sound based upon the difference between signal levels or the loudness of playback sound and the ambient sound. As such, the apparatus, such as the processor, of this embodiment may cause the playback sound to have a volume level that has a predefined relationship to the volume level to the ambient sound, such that the playback sound may be heard by the user in a predefined manner relative to the ambient sound in response to certain volume control inputs.

With respect to the example of FIG. 7, a volume control input of 0 may cause the volume level of the playback sound to be set to 0 and may cause the volume level of the ambient sound to be such that the ambient sound is presented to the user in the same manner as if the user were not wearing headphones 10. Thus, in an instance in which the headphones attenuate the ambient sound by one-half, the apparatus 20, such as the processor 22, may apply a gain of 0.5 to the ambient sound captured by a microphone 12 carried by a headphone that is then mixed with the ambient sound which passes through the headphones such that the resulting ambient sound presented to the user is the same as if the user were not wearing headphones. In another embodiment, however, the volume level in response to volume control input of 0 may be the same volume level as that in which the noise cancellation headphones has been deactivated.

In response to volume control input of 1, the apparatus 20, such as the processor 22, may be configured to control the volume level of the ambient sound in the same manner as described above in conjunction of volume control 0. However, the apparatus, such as the processor, may be configured to control the playback sound such that there is a predefined difference, e.g., 30 db, between the volume level of the ambient sound and the volume level of the playback sound.

As the volume control input is increased from 1 to 4, the apparatus 20, such as the processor 22, in this example embodiment may gradually increase the volume level of the playback sound while maintaining the volume level of the ambient sound in such a manner that the difference between the volume level of the ambient sound and the volume level of the playback sound is maintained at a predetermined level, albeit a different predetermined level at each volume control input. In this regard, the predetermined difference at volume control inputs of between 1 and 3 may be such that the volume level of the ambient sound is greater than the volume level of the playback signal, but the predetermined difference decreases from volume control 1 to volume control 3. The apparatus, such as the processor, may be configured such that at volume control 3 the predetermined difference between the volume level of the ambient sound and the volume level of the playback sound is 0 and for volume control inputs between 3 and 4, the predetermined difference may be such that the volume level of the playback sound is greater than the volume level of the ambient level with the predetermined difference increasing as the volume control input increases. For example, the predetermined difference between the volume levels of the playback sound and the ambient sound for volume control input 4 may be 10 db.

The apparatus 20, such as the processor 22, of this example embodiment may be configured such that the volume level for the ambient sound is reduced and the volume level of the playback sound remains approximately the same for volume control inputs 4-6 such that the relative volume level of the playback sound with respect to the ambient sound generally increases. For volume control input greater than 6, the apparatus, such as the processor, may be configured to maintain the volume level of the ambient sound at a relative constant low level while the volume level of the playback sound gradually increases, such as in an approximately linear manner as shown in FIG. 7. As such, the volume level of the playback sound relative to the volume level of the ambient sound continues to increase even though the volume level of the ambient sound remains approximately the same.

As the foregoing examples illustrate, the playback sound is more audible from the perspective of human hearing and perception in response to larger volume control inputs than in response to smaller volume control inputs. In order to permit the playback sound to be heard and perceived in the desired manner, the apparatus 20, such as the processor 22, of an example embodiment may be configured to make the ambient sound more or less audible, such as in accordance with a gain curve that provides different amounts of gains for different ranges or sections of the volume control input. For example, more gain may be applied to the ambient noise in response to smaller volume control inputs and less gain may be applied to the ambient noise in response to larger volume control inputs such that the playback sound may be heard or perceived to lesser and greater degrees, respectively, as a result of the ambient sound and the gain concurrently applied to the playback sound. In one example embodiment, the range of the volume control input may divided into subsections, such as represented by the volume control inputs designated 0-8 in the foregoing examples depicted in FIGS. 4 and 7, with different gain being applied to the playback sound and the ambient sound in the different subsections of the volume control inputs to permit the playback sound to be heard or perceived relative to the ambient sound in the desired manner that corresponds to the respective subsection of the volume control inputs.

Although described above in conjunction with a predetermined difference between signal levels of the playback sound and the ambient sound, the apparatus 20, such as the processor 22, may be configured such that the volume level of the playback sound or the volume level of the ambient sound is modified based upon the difference between the loudness of the playback sound and the ambient sound, such as may be determined based upon a psychoacoustic model.

An example embodiment of the manner in which at least one of the volume level of the playback sound or the volume level of the ambient sound may be modified based upon the difference between signal levels or loudness of the playback sound and the ambient sound is depicted in FIG. 8. As described above in conjunction with FIG. 5, left and right channels of the playback sound and left and right channels of the ambient sound are received and the ambient sound may be subjected to ambience level control. In the embodiment of FIG. 8, however, the apparatus 20, such as the processor 22, not only receives the volume control input, but also information indicative of the volume level of the playback sound such as the volume levels of the left and right channels of the playback sound and information indicative of the volume level of the ambient sound, such as information indicative of the volume levels of the left and right channels of the ambient sound. Based upon the volume control input and information regarding the volume levels of the playback sound and the ambient sound, the apparatus, such as the processor of this embodiment controls the volume levels of both the playback sound, such as the volume levels of the left and right channels of the playback sound, and the volume level of the ambient sound, such as the volume levels of the left and right channels of the ambient sound delivered to the user via the headphones 10; one example of which is shown in FIG. 7. The left channels of the playback sound and the ambient sound may then be mixed prior to being delivered to the user as the left headphone signal and the right channels of the playback sound and the ambient sound may also be mixed prior to being delivered as the right headphone signal.

As described, a method, apparatus 20 and computer program product are provided in accordance with an example embodiment in order to facilitate control of volume levels of both the playback sound and the ambient sound delivered to a user via headphones 10 in response to user actuation of a single input. By permitting the volume levels of both the playback sound and the ambient sound to be controlled via a single input, the user interface may be simplified and the control of playback sound and the ambient sound may be more integrated than headphones that are responsive to separate inputs for the volume level of the playback sound and the volume level of the ambient sound.

As described above, FIG. 3 illustrates a flowchart of an apparatus 20, method and computer program product according to example embodiments of the invention. It will be understood that each block of the flowchart, and combinations of blocks in the flowchart, may be implemented by various means, such as hardware, firmware, processor, circuitry, and/or other communication devices associated with execution of software including one or more computer program instructions. For example, one or more of the procedures described above may be embodied by computer program instructions. In this regard, the computer program instructions which embody the procedures described above may be stored by a memory device 24 of an apparatus employing an embodiment of the present invention and executed by a processor 22 of the apparatus. As will be appreciated, any such computer program instructions may be loaded onto a computer or other programmable apparatus (for example, hardware) to produce a machine, such that the resulting computer or other programmable apparatus implements the functions specified in the flowchart blocks. These computer program instructions may also be stored in a computer-readable memory that may direct a computer or other programmable apparatus to function in a particular manner, such that the instructions stored in the computer-readable memory produce an article of manufacture the execution of which implements the function specified in the flowchart blocks. The computer program instructions may also be loaded onto a computer or other programmable apparatus to cause a series of operations to be performed on the computer or other programmable apparatus to produce a computer-implemented process such that the instructions which execute on the computer or other programmable apparatus provide operations for implementing the functions specified in the flowchart blocks.

Accordingly, blocks of the flowchart support combinations of means for performing the specified functions and combinations of operations for performing the specified functions for performing the specified functions. It will also be understood that one or more blocks of the flowchart, and combinations of blocks in the flowchart, can be implemented by special purpose hardware-based computer systems which perform the specified functions, or combinations of special purpose hardware and computer instructions.

In some embodiments, certain ones of the operations above may be modified or further amplified. Furthermore, in some embodiments, additional optional operations may be included. Modifications, additions, or amplifications to the operations above may be performed in any order and in any combination.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. A method for controlling sound reproduction from an electronic device comprising:

receiving a control signal responsive to user actuation of a volume control input configured to operate in a predetermined range for increasing or decreasing a volume level of a playback sound from a source inside an electronic device, wherein the control signal is configured to operate in accordance with a first predetermined gain curve for the playback sound and wherein the first predetermined gain curve is provided for the predetermined range based on the volume level of the playback sound;

determining an ambient sound around the electronic device as captured by one or more microphones, wherein the ambient sound is provided to an output channel of a headphone device and a volume level of the ambient sound from the output channel is controlled in response to the control signal based on the same volume control input in accordance with a second predetermined gain curve provided for the ambient sound in the predetermined range; and in response to the control signal, controlling, with a processor, volume levels of both the playback sound from the source and the ambient sound provided to the output channel in such a way that the control signal operates in subsections of the predetermined range, wherein the subsections are predetermined and selectable by the volume control input, and wherein the first predetermined gain curve and the second predetermined gain curve are different for the volume levels of the playback sound and the ambient sound, respectively.

2. A method according to claim 1 wherein controlling the volume level of the playback sound and the volume level of the ambient sound comprises providing more gain to the ambient sound than to the playback sound in response to a first type of control signal and providing more gain to the playback sound than to the ambient sound in response to a second type of control signal.

3. A method according to claim 1 wherein determining the ambient sound comprises processing the ambient sound for ambience level control, wherein the playback sound comprises left and right channels of the playback sound and the ambient sound comprises left and right channels of the ambient sound, and wherein the method further comprises, after processing the ambient sound for ambience level control and controlling the volume levels of both the playback sound and the ambient sound, mixing the left channels of the playback sound and the ambient sound and mixing the right channels of the playback sound and the ambient sound for delivery to left and right headphone channels, respectively.

4. A method according to claim 1 wherein controlling the volume levels of the playback sound and the ambient sound comprises controlling the volume level of the ambient sound in accordance with the second predetermined gain curve as a function of the control signal.

5. A method according to claim 1 wherein in response to the control signal being a first control signal, a first predetermined difference is maintained between the volume levels of the playback sound and ambient sound, while in response to the control signal being a second control signal, different than the first control signal, a second predetermined difference, different than the first predetermined difference, is maintained between the volume levels of the playback sound and ambient sound.

6. An apparatus comprising at least one processor and at least one memory storing computer program code, wherein the at least one memory and stored computer program code are configured, with the at least one processor, to cause the apparatus to at least:

receive a control signal responsive to user actuation of a volume control input configured to operate in a predetermined range for increasing or decreasing a volume level of a playback sound from a source inside the apparatus, wherein the control signal is configured to operate in accordance with a first predetermined gain curve for the playback sound and wherein the first predetermined gain curve is provided for the predetermined range based on the volume level of the playback sound;

determine an ambient sound around the apparatus as captured by one or more microphones, wherein the ambient sound is provided to an output channel of a headphone device and a volume level of the ambient sound from the output channel is controlled in response to the control signal based on the same volume control input in accordance with a second predetermined gain curve provided for the ambient sound in the predetermined range; and in response to the control signal, control volume levels of both the playback sound from the source and the ambient sound provided to the output channel in such a way that the control signal operates in subsections of the predetermined range, wherein the subsections are predetermined and selectable by the volume control input, and wherein the first predetermined gain curve and the second predetermined gain curve are different for the volume levels of the playback sound and the ambient sound, respectively.

7. An apparatus according to claim 6 wherein the at least one memory and stored computer program code are configured, with the at least one processor, to cause the apparatus to control the volume level of the playback sound and the volume level of the ambient sound by providing more gain to the ambient sound than to the playback sound in response to a first type of control signal and by providing more gain to the playback sound than to the ambient sound in response to a second type of control signal.

8. An apparatus according to claim 6 wherein the at least one memory and stored computer program code are configured, with the at least one processor, to cause the apparatus to determine the ambient sound by processing the ambient sound for ambience level control, wherein the playback sound comprises left and right channels of the playback sound and the ambient sound comprises left and right channels of the ambient sound, and wherein the at least one memory and stored computer program code are further configured, with the at least one processor, to cause the apparatus, after processing the ambient sound for ambience level control and controlling the volume levels of both the playback sound and the ambient sound, to mix the left channels of the playback sound and the ambient sound and to mix the right channels of the playback sound and the ambient sound for delivery to left and right headphone channels, respectively.

9. An apparatus according to claim 6 wherein the at least one memory and stored computer program code are configured, with the at least one processor, to cause the apparatus to control the volume levels of both the playback sound and the ambient sound by controlling the volume level of the ambient sound in accordance with the second predetermined gain curve as a function of the control signal.

10. An apparatus according to claim 6 wherein in response to the control signal being a first control signal, a first predetermined difference is maintained between the volume levels of the playback sound and ambient sound, while in response to the control signal being a second control signal, different than the first control signal, a second predetermined difference, different than the first predetermined difference, is maintained between the volume levels of the playback sound and ambient sound.

11. A computer program product for controlling sound reproduction from an electronic device, wherein the computer program product comprises at least one non-transitory computer-readable storage medium having computer-readable program instructions stored therein, the computer-readable program instructions configured, upon execution, to:

receive a control signal responsive to user actuation of a volume control input configured to operate in a predetermined range for increasing or decreasing a volume level of a playback sound from a source inside the electronic device, wherein the control signal is configured to operate in accordance with a first predetermined gain curve for the playback sound and wherein the first predetermined gain curve is provided for the predetermined range based on the volume level of the playback sound;

determine an ambient sound around the electronic device as captured by one or more microphones, wherein the ambient sound is provided to an output channel of a headphone device and a volume level of the ambient sound from the output channel is controlled in response to the control signal based on the same volume control input in accordance with a second predetermined gain curve provided for the ambient sound in the predetermined range; and in response to the control signal, control volume levels of both the playback sound from the source and the ambient sound provided to an output channel in such a way that the control signal operates in subsections of the predetermined range, wherein the subsections are predetermined and selectable by the volume control input, and wherein the first predetermined gain curve and the second predetermined gain curve are different for the volume levels of the playback sound and the ambient sound, respectively.

12. A computer program product according to claim 11 wherein the computer-readable program instructions configured to control the volume levels of the playback sound and the ambient sound comprise computer-readable program instructions configured to provide more gain to the ambient sound than to the playback sound in response to a first type of control signal and to provide more gain to the playback sound than to the ambient sound in response to a second type of control signal.

13. A computer program product according to claim 11 wherein the computer-readable program instructions configured to determine the ambient sound comprise computer-readable program instructions configured to process the ambient sound for ambience level control, wherein the playback sound comprises left and right channels of the playback sound and the ambient sound comprises left and right channels of the ambient sound, and wherein the computer-readable program instructions are further configured, after processing the ambient sound for ambience level control and controlling the volume levels of both the playback sound and the ambient sound, to mix the left channels of the playback sound and the ambient sound and mix the right channels of the playback sound and the ambient sound for delivery to left and right headphone channels, respectively.

14. A computer program product according to claim 11 wherein in response to the control signal being a first control signal, a first predetermined difference is maintained between the volume levels of the playback sound and ambient sound, while in response to the control signal being a second control signal, different than the first control signal, a second predetermined difference, different than the first predetermined difference, is maintained between the volume levels of the playback sound and ambient sound.

* * * * *